(12) United States Patent
Berzins et al.

(10) Patent No.: US 8,975,949 B2
(45) Date of Patent: Mar. 10, 2015

(54) INTEGRATED CLOCK GATER (ICG) USING CLOCK CASCODE COMPLIMENTARY SWITCH LOGIC

(71) Applicants: Matthew S. Berzins, Cedar Park, TX (US); Prashant U. Kenkare, Austin, TX (US)

(72) Inventors: Matthew S. Berzins, Cedar Park, TX (US); Prashant U. Kenkare, Austin, TX (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/831,500

(22) Filed: Mar. 14, 2013

(65) Prior Publication Data
US 2014/0266396 A1 Sep. 18, 2014

(51) Int. Cl.
*H03K 17/284* (2006.01)

(52) U.S. Cl.
CPC .................................. *H03K 17/284* (2013.01)
USPC ............................. 327/399; 327/291; 327/299

(58) Field of Classification Search
USPC .......................................... 327/399, 291, 299
See application file for complete search history.

(56) References Cited

U.S. PATENT DOCUMENTS

| | | | |
|---|---|---|---|
| 6,411,152 B1 * | 6/2002 | Dobberpuhl ................... | 327/291 |
| 6,535,036 B1 * | 3/2003 | Dobberpuhl ................... | 327/108 |
| 6,717,448 B2 * | 4/2004 | Heo et al. ....................... | 327/202 |
| 6,809,570 B2 | 10/2004 | Francom | |
| 7,131,092 B2 * | 10/2006 | Ham ............................... | 716/113 |
| 7,365,575 B2 | 4/2008 | Kim | |
| 7,411,420 B2 * | 8/2008 | Doi ................................. | 326/82 |
| 7,437,800 B2 * | 10/2008 | Ham ............................... | 716/100 |
| 7,541,832 B1 * | 6/2009 | Clark et al. ..................... | 326/37 |
| 7,612,597 B2 | 11/2009 | Matsumoto | |
| 7,622,977 B2 * | 11/2009 | Papaefthymiou et al. ..... | 327/208 |
| 7,639,057 B1 | 12/2009 | Su | |
| 7,808,279 B2 | 10/2010 | Srivastava et al. | |
| 7,902,878 B2 | 3/2011 | Saint-Laurent et al. | |
| 8,030,982 B2 | 10/2011 | Datta et al. | |
| 8,339,158 B2 * | 12/2012 | Li et al. ........................... | 327/57 |
| 8,434,047 B1 * | 4/2013 | Jiang et al. ..................... | 716/133 |
| 2006/0097754 A1 * | 5/2006 | Kim ................................. | 326/95 |
| 2007/0016883 A1 * | 1/2007 | Ham ............................... | 716/10 |
| 2008/0238514 A1 | 10/2008 | Kim | |
| 2011/0133806 A1 | 6/2011 | Subramani et al. | |
| 2013/0176156 A1 * | 7/2013 | Danjo .............................. | 341/155 |

* cited by examiner

*Primary Examiner* — Ryan Jager
(74) *Attorney, Agent, or Firm* — Renaissance IP Law Group LLP

(57) ABSTRACT

Inventive aspects include an integrated clock gater (ICG) circuit having clocked complimentary voltage switched logic (CICG) that delivers high performance while maintaining low power consumption characteristics. The CICG circuit provides a small enable setup time and a small clock-to-enabled-clock delay. A significant reduction in clock power consumption is achieved in both enabled and disabled modes, but particularly in the disabled mode. Complimentary latches work in tandem to latch different voltage levels at different nodes depending on the voltage level of the received clock signal and whether or not an enable signal is asserted. An inverter takes the voltage level from one of the nodes, inverts it, and outputs a gated clock signal. The gated clock signal may be active or quiescent depending on the various voltage levels. Time is "borrowed" from an evaluation window and added to a setup time to provide greater tolerances for receiving the enable signal.

18 Claims, 10 Drawing Sheets

INTEGRATED CLOCK GATER (ICG) USING CLOCK CASCODE COMPLIMENTARY SWITCH LOGIC

BACKGROUND

The present inventive concepts relate to clock gating, and more particularly to an integrated clock gater (ICG) circuit using complimentary switch logic having high performance and low power consumption characteristics.

Mobile devices are becoming ubiquitous. Such devices include smart phones, tablets, personal digital assistants (PDAs), notebook computers, and the like. Digital processors are used in such devices for executing logical instructions. The digital processors operate in response to one or more clock signals. With each pulse of the clock signal, one or more logical instructions can be executed or partially executed by the processor. In this manner, the mobile devices can perform functions that have become integral and useful to the personal lives of millions of people.

Typically, clock elements within the processor tend to consume relatively large amounts of power due to high frequency activity. To avoid power waste, techniques have been developed to limit high frequency clock activity. Quite often, one or more state machines or sequential elements within the processor are dormant while waiting for other events to occur. The high frequency clock signal fed to these elements can be "gated" by clock gating, which sets the gated clock to a quiescent state.

Clock gating is a power mitigation technique that can be accomplished using specially designed clock gating cells. When the clock gating cell is enabled, the clock signal is passed from its input clock pin to its output—the enabled clock pin. When the clock gating cell is gated, the output clock signal is held in its quiescent state, which is typically a logical value of zero for positive edge-triggered state elements.

FIG. 1 is an example of a conventional clock gating circuit referred to as an enable pre-latched on clock low integrated clock gater circuit, also sometimes referred to as a PREICG circuit. The PREICG circuit includes an AND gate 125 and a latch 120. The AND gate 125 receives a clock signal CLK 105 and an enable signal EN 115. The latch 120 latches the enable signal 115 while CLK 105 is at a logic level 0 state. The enable signal 115 is considered to be latched once CLK 105 transitions to a logic level 1 state. The output of latch 120 is EN_LAT 130. The value of EN_LAT 130 does not change while CLK 105 is in a logical 1 state. When the EN_LAT 130 signal is asserted, the clock signal CLK 105 is passed through the AND gate 125, such that GATED CLK 110 is now an active clock signal. On the other hand, when the EN_LAT 130 signal is not asserted, the clock signal CLK 105 is not passed through the AND gate 125, but instead, the gated clock signal GATED CLK 110 is quiescent.

Some of the disadvantages of the PREICG clock gating circuit include large enable setup requirements and high latency (i.e., insertion delay), which can impact clock uncertainty and can also decrease the maximum possible frequency. In addition, combined with complex combinations of clock gating, the enable signal can have very little arrival slack. Moreover, the PREICG clock gating circuit degrades the maximum frequency to about 1 GHz due to high enable setup and insertion times.

Another conventional approach is shown in FIG. 2. This type of clock gating circuit is referred to as a pulse-based integrated clock gater (PICG) circuit. The PICG circuit creates an internal pulse that is smaller than the regular clock signal. The internal pulse can have a frequency that is twice that of the regular clock signal. In a critical path within certain circuitry of the processor, the performance can be doubled for a period of time, and then at some point later, the performance is returned to the normal mode.

As can be seen in FIG. 2, the PICG circuit includes a pulse circuit 245, a latch 220, an inverter 250 and other control elements such as transistors P1, N1 and N2. The pulse circuit 245 includes a delay circuit 240, a NAND gate 225, and an inverter 230. The width of the internal pulse is defined by the amount of delay introduced by the delay circuit 240. The NAND gate 225 receives the clock signal CLK 205 and the delayed clock signal, and from these signals, produces a pulsed clock signal CLK 235. The pulsed clock signal CLK 235 controls whether or not the control transistor N2 is turned on or off. An enable signal 215 controls whether or not the transistor N1 is turned on or off. The regular clock signal CLK 205 controls whether or not the transistor P1 is turned on or off.

When the enable signal 215 is not asserted, the transistor N1 remains turned off, which causes the latch 220 to latch the voltage potential of node 'A' to a high level (e.g., VDD), despite the ongoing oscillations of the clock signal CLK 205. The inverter 250 inverts this high level to a low level, which results in the GATED CLK 210 being set to a quiescent state. Conversely, when the enable signal 215 is asserted, the transistor N1 is turned on, which causes the flow of electrical current from node 'A' to GND to be dependent on transistors N2 and P1. In other words, in this state, node 'A' swings between VDD and GND at the frequency of the pulsed clock signal CLK 235. As a result, the gated clock signal CLK 210 swings between VDD and GND at the frequency of the pulsed clock signal CLK 235, although at an opposite polarity due to the inverter 250.

One of the benefits of the PICG design is that they have a small setup time. In other words, the enable signal EN 215 can arrive close to the rising edge of the clock signal CLK 205. This provides additional cycle time to meet timing on critical paths. However, this comes at the expense of high power usage because the pulse circuit 245 consumes significant power and is always on. In other words, the pulse circuit 245 itself is never clock gated, but rather, it continually consumes energy. The PICG circuit power usage is 1.5 times that of the PREICG circuit when the clock is enabled, and up to 10 times the power usage of the PREICG circuit when the clock is in a disabled mode. Consequently, even if the enable signal EN 215 is not asserted, the PICG circuit is always consuming clock power.

What is needed is an integrated clock gater (ICG) circuit that delivers high performance and low power consumption. It would also be desirable to provide an ICG circuit having a small enable setup time and a small clock-to-enabled-clock delay. The inventive concepts disclosed herein implement clocked complimentary voltage switched logic within an ICG circuit (generally referred to herein as a CICG circuit), thereby delivering a significant reduction in clock power consumption in the enabled mode, and a particularly significant reduction in power when in the disabled mode. Together with related inventive concepts disclosed herein, these and other limitations in the prior art are addressed.

BRIEF SUMMARY

Inventive concepts may include a method for gating a clock signal using complimentary switch logic. The method may include receiving a clock signal, pre-charging a first node and a second node to a high voltage level responsive to the clock signal having a low voltage level; latching, by a first latch, a first node to the low voltage level responsive to the clock signal having the high voltage level; and latching, by a second latch, a second node to the high voltage level responsive to the clock signal having the high voltage level. In addition to the state of the incoming clock signal, the values that are latched also dependent on whether or not en enable signal is asserted. A gated clock signal is produced based at least on the voltage level of the first node.

The method may further include providing a setup time in which an enable signal can be received, evaluating voltage levels of the first and second nodes within an evaluation window, borrowing time from the evaluation window and adding the borrowed time to the setup time in which the enable signal can be received so that additional time is provided for receiving the enable signal. The complimentary latches include the first and second latches.

The method may further include receiving the enable signal, producing a gated clock signal that mimics the clock signal when the enable signal is asserted at the high voltage level, and producing a gated clock signal that is quiescent after the enable signal is de-asserted at the low voltage level. When the enable signal is de-asserted at the low voltage level, the method may include completing mimicking of an entire pulse of the clock signal in which the de-assertion occurs. Responsive to the de-assertion of the enable signal, the method may include latching the first and second nodes to the low voltage level so that the entire pulse of the clock signal is mimicked by the gated clock signal.

The method may further include receiving an assertion of an enable signal when the clock signal is at the high voltage level, and despite the assertion of the enable signal, continuing to produce a gated clock signal that is quiescent.

According to features and principles of the present inventive concepts, an ICG using clock cascade complimentary switch logic may include first and second pre-charge transistors configured to receive a clock signal, a first node connected to the first pre-charge transistor, the first pre-charge transistor being configured to pre-charge the first node responsive to the clock signal, a second node connected to the second pre-charge transistor, the second pre-charge transistor being configured to pre-charge the second node responsive to the clock signal, a first latch connected to the first node, and a second latch connected to the second node.

The CICG circuit may further include an inverter connected to the first node, the inverter being configured to invert a voltage level of the first node and to produce a gated clock signal. The CICG circuit may further include an evaluation transistor configured to receive the clock signal, an enable transistor connected to the evaluation transistor and configured to receive an enable signal, and an inverse-enable transistor connected to the second node and to the evaluation transistor, the inverse-enable transistor being configured to receive an inverted enable signal. The CICG circuit may further include a control transistor connected to the first node, the second node, and the enable transistor. The first node may be connected to a gate of the control transistor. The evaluation transistor may be connected to a low voltage potential. The first and second pre-charge transistors may be connected to a high voltage potential that is higher than the low voltage potential.

Certain of the inventive features may be best achieved by implementing them in a processor such as within ARM processor core. Other types of processors can implement the inventive principles disclosed herein. The inventive concepts may be implemented within processors of a variety of mobile devices such as smart phones, tablets, notebook computers, or the like, or in a variety of stationary devices such as desktop computers, routers, or the like.

The inventive principles described and illustrated herein provide a significant reduction in power consumption while maintaining high performance.

BRIEF DESCRIPTION OF THE DRAWINGS

The foregoing and additional features and advantages of the present inventive principles will become more readily apparent from the following detailed description, made with reference to the accompanying figures, in which.

DETAILED DESCRIPTION

Reference will now be made in detail to embodiments of the inventive concept, examples of which are illustrated in the accompanying drawings. In the following detailed description, numerous specific details are set forth to enable a thorough understanding of the inventive concept. It should be understood, however, that persons having ordinary skill in the art may practice the inventive concept without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first circuit could be termed a second circuit, and, similarly, a second circuit could be termed a first circuit, without departing from the scope of the inventive concept.

The terminology used in the description of the inventive concept herein is for the purpose of describing particular embodiments only and is not intended to be limiting of the inventive concept. As used in the description of the inventive concept and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

The mobile device space demands both high frequency characteristics as well as low-power characteristics, so that mobile devices can deliver high performance without impacting battery life. Significant power savings are achieved in accordance with inventive principles described herein, particularly when in a disabled mode. The clocked complimentary voltage switched logic ICG circuit (i.e., CICG circuit) described herein provides a balance of high performance and low power consumption to eliminate the long standing power and performance gap.

Figure 1:
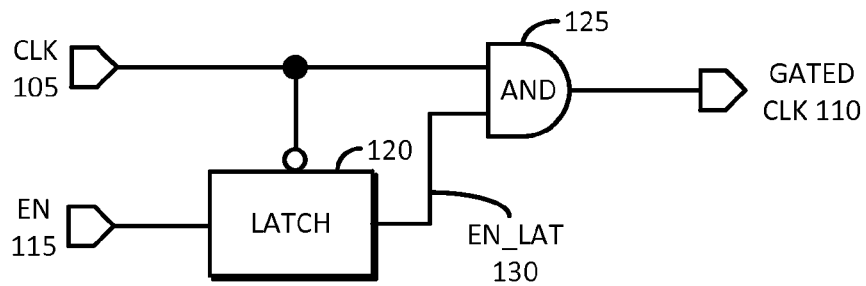
FIG. 1 is an example of a clock gating circuit referred to as an enable pre-latched on clock low integrated clock gater circuit, also sometimes referred to as a PREICG circuit, as known in the related art.
Figure 2:
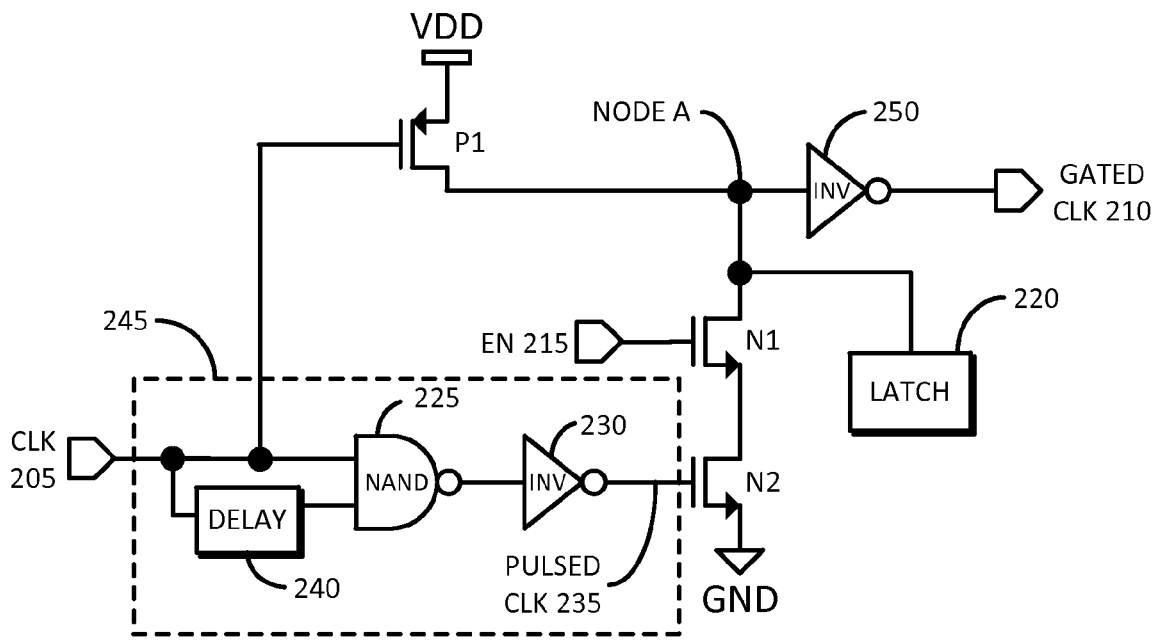
FIG. 2 is an example of another clock gating circuit referred to as pulse-based integrated clock gater circuit, also sometimes referred to as a PICG circuit, as known in the related art.
Figure 3:
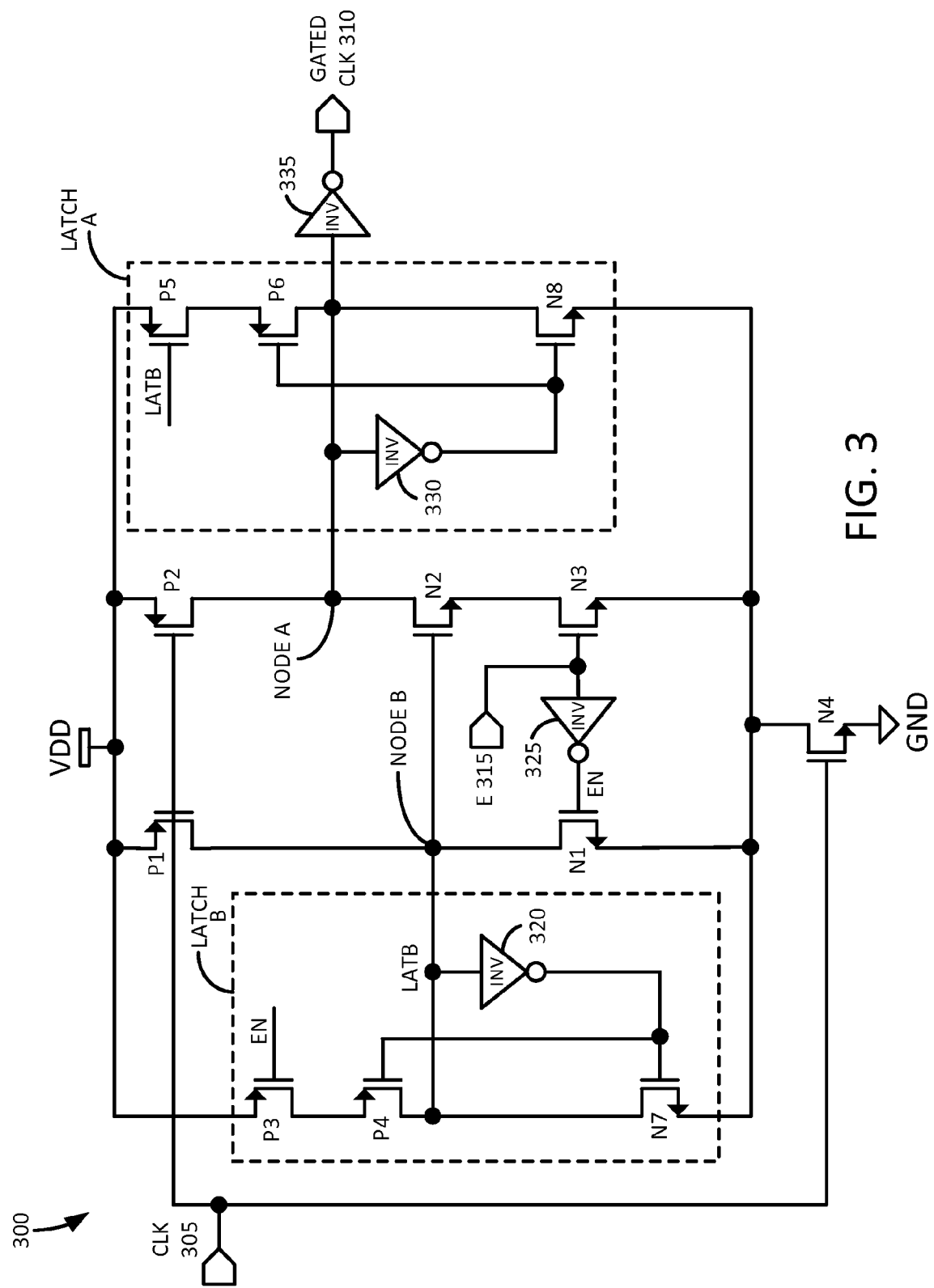
FIG. 3 is an example circuit diagram of a CICG circuit having clocked complimentary voltage switched logic, in accordance with inventive concepts.

FIG. 3 is an example circuit diagram of a CICG circuit 300 having clocked complimentary voltage switched logic, in accordance with inventive concepts. The CICG circuit 300 includes two complimentary latches—latch 'A' and latch 'B.' With two complimentary latches, it takes some time for the latches to hit their trip points. This period of time, sometimes referred to herein as borrowed time, is caused by electrical momentum and positive feedback between the two latches. It is referred to herein as "borrowed time" because time is "borrowed" from an evaluation window. The evaluation window is a period of time in which the clock signal is high. The borrowed time is added to a setup time in which the enable signal can be received so that additional time is provided for receiving and/or latching the enable signal, as described in detail below. Moreover, the pulse-based circuit as shown in FIG. 2 is eliminated, thereby significantly reducing power consumption.

The CICG circuit 300 receives a clock signal CLK 305 and outputs a gated clock signal CLK 310. When the CICG circuit 300 is in an "active" mode, the clock signal CLK 305 is essentially passed through as the gated clock signal CLK 310. On the other hand, when in a "disabled" mode, the nodes 'A' and 'B' can be held to a fixed voltage level, which significantly reduces power when in the disabled mode. When in the disabled mode, the gated clock signal CLK 310 is quiescent, which usually corresponds to a low level or zero voltage potential level. The CICG circuit 300 can also receive an enable E 315 signal. The enable E 315 signal controls whether the CICG circuit 300 produces an active or quiescent gated clock signal CLK 310.

Initially, in the disabled mode, when the clock signal CLK 305 is at a low level, the evaluation transistor N4 remains turned off and the transistors P1 and P2 remain turned on. N-type transistors are labeled in the figures as NX. P-type transistors are labeled in the figures as PX. The N-type and P-type transistors can be MOSFET type transistors. It will be understood, however, that any suitable transistors and transistor types can be used.

In such a disabled mode, node 'A' and node 'B' are each pre-charged to a voltage potential of VDD, which generally corresponds to a high logical level. Such pre-charging occurs because there is a high-impedance path between each node and the ground voltage potential (i.e., GND) due to the evaluation transistor N4 being turned off. Latch 'A' latches the voltage potential VDD at node 'A.' Latch 'B' latches the voltage potential VDD at node 'B.' Because there are little to no fluctuations of the voltage levels at nodes 'A' and 'B' during this mode, very little power is consumed. The CICG circuit can remain in the disabled mode for any suitable period of time.

When the clock signal CLK 305 swings to a high level, an evaluation mode begins. Each evaluation mode lasts for the duration of a corresponding high level (i.e., evaluation window) of the clock signal CLK 305. During the evaluation mode, the latches 'A' and 'B' evaluate the voltage potentials at nodes 'A' and 'B,' and at least one of the nodes is pulled down to GND depending on the value and timing of the enable signal E 315, as further described in detail below with reference to waveform timing diagrams.

A detailed description of the structural aspects of the CICG circuit 300 is now provided. Latch 'A' includes three transistors arranged in series—P5, P6, and N8. The gate of P5 is "air connected" to node LATB of latch 'B.' In other words, while the line is not shown for the sake of showing a cleaner diagram, such connecting line is understood to be present. An inverter 330 is disposed between node 'A' and the gate of N8. The gate of P6 is connected to the gate of N8. The source of P5 is connected to VDD. The source of N8 is connected to the drain of N4.

Latch 'B' is structurally similar to Latch 'A.' Specifically, latch 'B' includes three transistors arranged in series—P3, P4, and N7. The gate of P3 is "air connected" to the signal EN that is output from the inverter 325. Another inverter 320 is disposed between node 'B' and the gate of N7. The gate of P4 is connected to the gate of N7. The source of P3 is connected to VDD. The source of N7 is connected to the drain of N4. One of the latches (e.g., 'A' or 'B') may be designed to have slightly slower characteristics than the other.

The pre-charge transistors P1 and P2 are connected to the clock pin carrying the clock signal CLK 305. The sources of the transistors P1 and P2 are connected to VDD and the drains to node 'B' and node 'A,' respectively. The control transistor N2 is disposed between the pre-charge transistor P2 and an enable transistor N3. The gate of the control transistor N2 is connected to node 'B.' The gate of the enable transistor N3 receives the enable signal E 315.

An inverse-enable transistor N1 is disposed between the pre-charge transistor P1 and the evaluation transistor N4. The gate of the inverse-enable transistor N1 is connected to an output of the inverter 325. As such, the gate of the transistor receives the EN signal, which is the enable signal E 315 inverted.

The latch 'B' is connected to node 'B' and is configured to evaluate a voltage potential of node 'B,' and to latch a voltage level based on the evaluation. Similarly, the latch 'A' is connected to node 'A' and is configured to evaluate a voltage potential of node 'A,' and to latch a voltage level based on the evaluation. The state of the clock signal CLK 305 and the value and timing of the enable signal E 315 influence how the latches 'A' and 'B' evaluate and latch the voltage levels of nodes 'A' and 'B.' In addition, an inverter 335 is connected to node 'A' and inverts the voltage level of node 'A,' which is output as the gated clock signal CLK 310. The embodiment shown in FIG. 3 uses P-type transistors for precharging to a VDD level, and N-type transistors for evaluating to a GND level. However, those ordinarily skilled in the art will recognize that the circuit can also be implemented using N-type transistor for precharging to a GND level, and P-type transistors for evaluating to a VDD level. Such an alternative implementation is intended to be covered by the spirit of the embodiment shown in FIG. 4.

Figure 4:
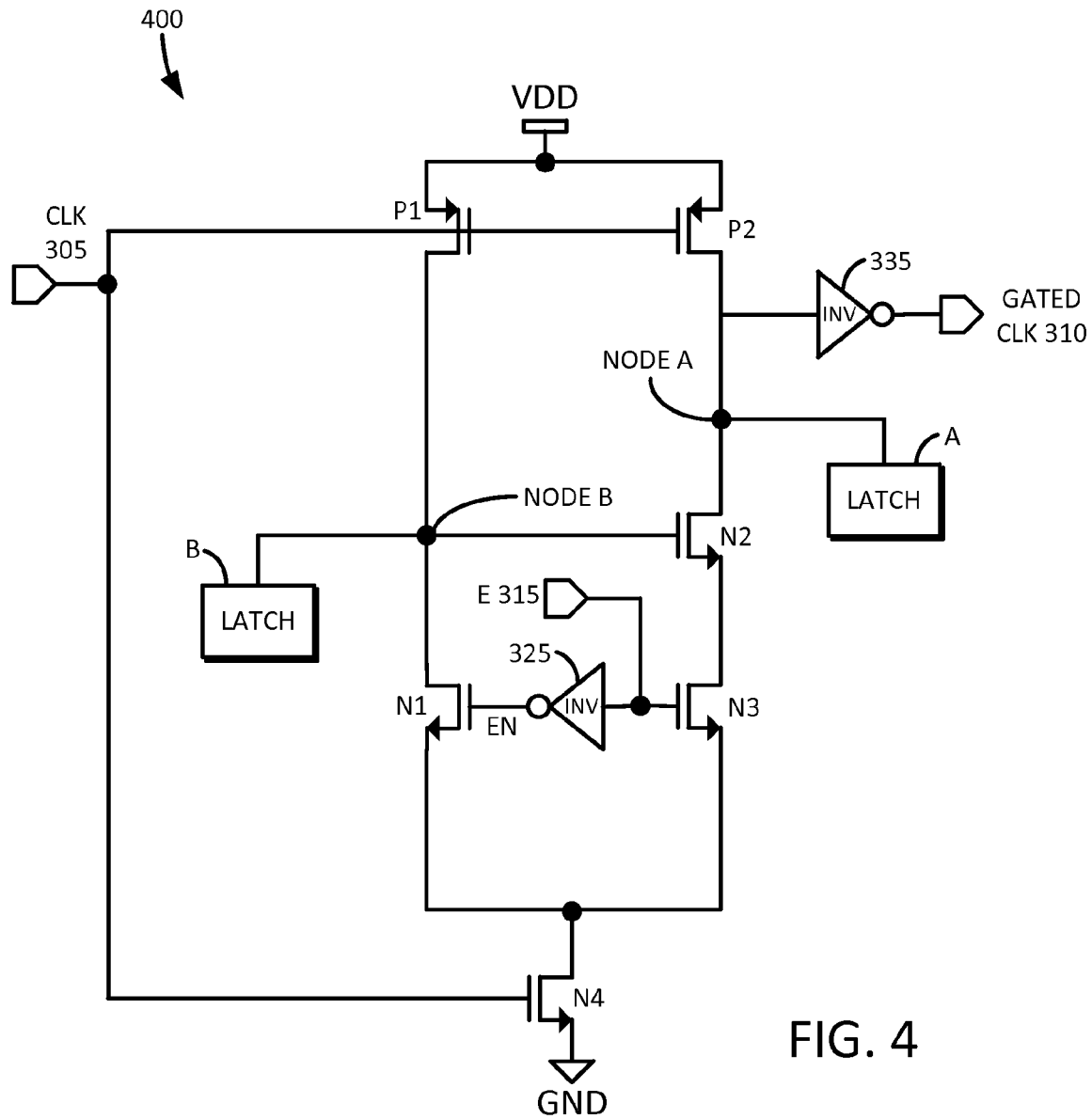
FIG. 4 is another example circuit diagram of a CICG circuit having clocked complimentary voltage switched logic, in accordance with inventive concepts.

FIG. 4 is another example circuit diagram of a CICG circuit 400 having clocked complimentary voltage switched logic, in accordance with inventive concepts. The CICG circuit 400 is similar to the CICG circuit 300 of FIG. 3. As can be seen, the notable difference is that the latch circuits 'A' and 'B' are shown as boxes rather than detailed latch circuits. In some embodiments, at least one of the first and second latches comprises capacitive elements and does not comprise transistors that can be switched on or off. It will be understood that any suitable latch types can be used without departing from the inventive concepts disclosed herein.

Figure 5:
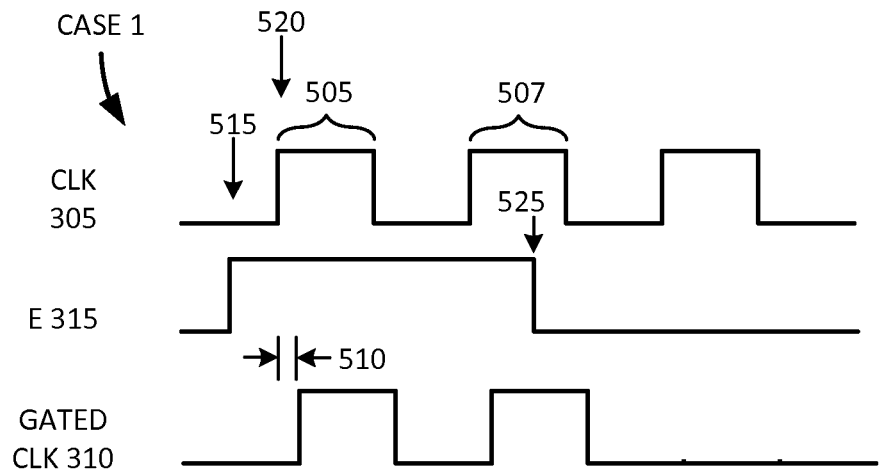
FIG. 5 is an example waveform timing diagram showing a gated clock signal activated by an enable signal, relating to the CICG circuits of FIGS. 3 and/or 4, and in accordance with inventive concepts.

FIG. 5 is an example waveform timing diagram showing a gated clock signal activated by an enable signal, relating to the CICG circuits of FIGS. 3 and/or 4, and in accordance with inventive concepts. This example is referred to as "Case 1" and shows a waveform diagram for activating the gated clock signal CLK 310. As shown in FIG. 5, the enable signal E 315 is asserted (e.g., at 515) before the evaluation window 505, which begins at 520 (i.e., at the rising edge of the clock signal CLK 305).

The enable signal E 315 is de-asserted at 525, which in this case, happens to occur when the clock signal CLK 305 is still high (i.e., during the evaluation window 507). When, as here, the enable signal E 315 is appropriately setup relative to the clock edge (e.g., 520), and even when the enable signal E 315 turns off (e.g., at 525) while the clock signal 305 is high, then the gated clock signal CLK 310 essentially follows or mimics the clock signal CLK 305. After the enable signal E 315 turns off, and the entire clock pulse 507 is fully propagated to the gated clock signal CLK 310, then the gated clock signal CLK 310 returns to a quiescent state. In other words, when the enable signal E 315 is de-asserted, the entire pulse of the clock signal CLK 305 in which the de-assertion occurs is mimicked by the gated clock signal CLK 310, and thereafter, the gated clock signal CLK 310 returns to a quiescent state.

Notably, there is a borrowed time period 510 in which the CICG circuit can determine the value of the enable signal E 315. In other words, the borrowed time period 510 is "borrowed" from the evaluation window 505, and added to a setup time in which the enable signal E 315 can be properly received, thereby enhancing the performance characteristics and tolerances of the CICG circuit. More specifically, the borrowed time period 510 is made possible due to the trip point difference between the latch 'A' and the latch 'B.' Such trip point difference occurs as a result of the nature of how the complimentary switch logic evaluates and latches voltage levels at nodes 'A' and 'B' during the evaluation mode. Because of the beneficial delay caused by the complimentary latches during the evaluation and latching phases, the enable signal E 315 has more time to be evaluated properly. As a result, the enable signal E 315 can arrive later than 515, or in other words, closer to or even after the rising edge of the clock signal CLK 305, and still be properly evaluated.

Figure 6:
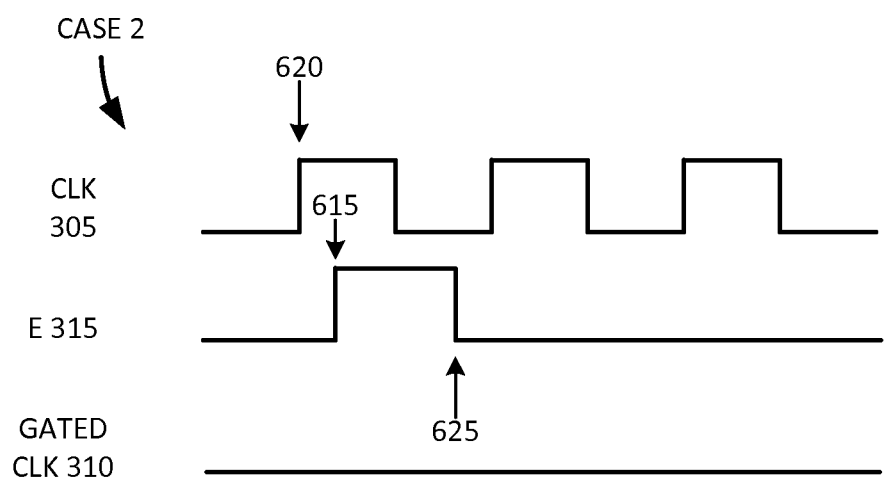
FIG. 6 is another example waveform timing diagram showing a gated clock signal in a quiescent state responsive to an enable signal, relating to the CICG circuits of FIGS. 3 and/or 4, and in accordance with inventive concepts.

FIG. 6 is another example waveform timing diagram showing a gated clock signal in a quiescent state responsive to an enable signal, relating to the CICG circuits of FIGS. 3 and/or 4, and in accordance with inventive concepts.

This example is referred to as "Case 2" and shows a waveform diagram in which the gated clock signal CLK 310 is not activated. As shown in FIG. 6, the enable signal E 315 is asserted (e.g., at 615) after the rising edge 620 of the clock signal CLK 305. When, as here, the enable signal E 315 is turned on after the clock signal 305 is high, then the gated clock signal CLK 310 remains gated or otherwise remains in a quiescent state. In some embodiments, only when the enable signal E 315 is turned on after the clock signal 305 has been high at least as long as or longer than the borrowed time 510 (of FIG. 5), then the gated clock signal CLK 310 remains gated or otherwise remains in a quiescent state. In other words, if an assertion of the enable signal E 315 arrives too late after clock signal CLK 305 transitions from low to high, then the gated clock signal CLK 310 does not follow the clock signal CLK 305, regardless of when the enable signal E 315 is de-asserted (e.g., which in this case, happens at 625).

Figure 7:
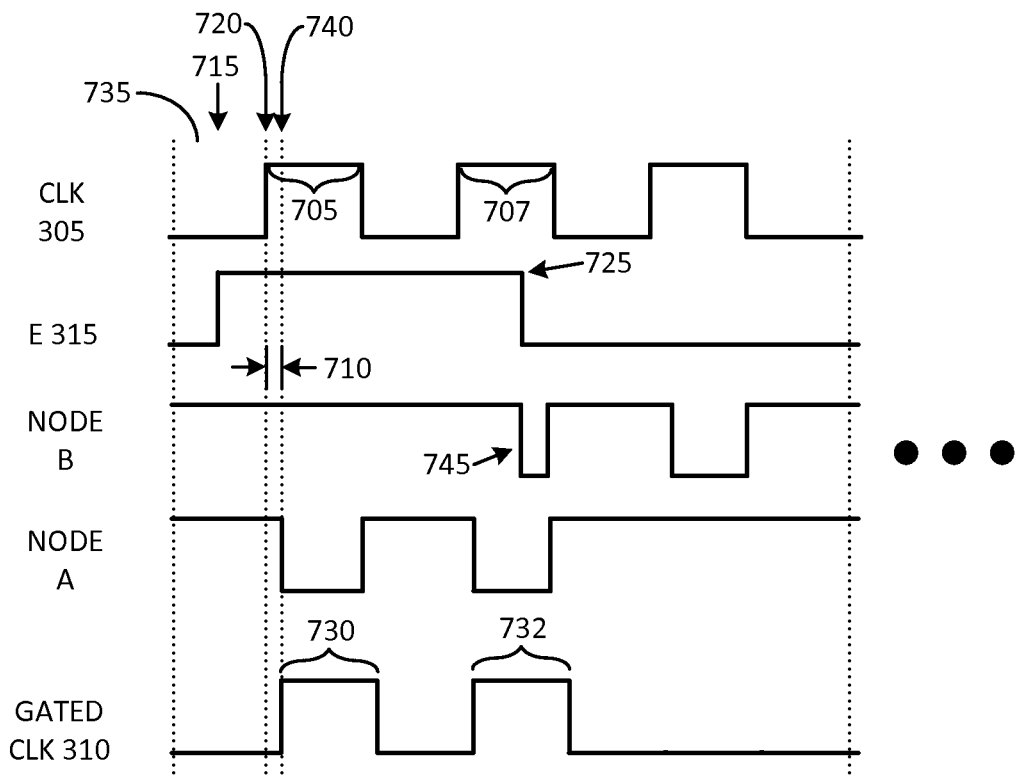
FIG. 7 is yet another example waveform timing diagram showing various waveforms associated with the CICG circuits of FIGS. 3 and/or 4, in accordance with inventive concepts.

FIG. 7 is yet another example waveform timing diagram showing various waveforms associated with the CICG circuits of FIGS. 3 and/or 4, in accordance with inventive concepts. FIG. 7 is similar to FIG. 5, but in addition, the waveforms for nodes 'A' and 'B' are shown, along with other notations as described in detail below. Reference is now made to FIGS. 3, 4, and 7.

As shown in FIG. 7, during a disabled mode 735, the clock signal CLK 305 is held at a low level, which causes node 'B' and node 'A' to be pre-charged to a high level. In this example, the enable signal E 315 is then asserted (e.g., at 715) before the evaluation window 705, which begins at 720. The rising edge 720 of the clock signal CLK 305 begins the evaluation mode. When the evaluation mode begins, latches 'A' and 'B' evaluate the voltages at nodes 'A' and 'B,' respectively.

Since in this case, the enable signal E 315 is appropriately setup relative to the rising edge 720 of the clock signal CLK 305, the following events occur. At 720, the pre-charge transistors P1 and P2 are turned off and the evaluation transistor N4 is turned on. The control transistor N2 remains turned on because, as mentioned above, node 'B' is initially pre-charged and latched to a high level, which is fed to the gate of N2. The enable transistor N3 also remains turned on because the enable signal E 315 is at a high level. Thus, a conductive path between node 'A' and GND is formed, which pulls node 'A' to a low level.

Meanwhile, the inverse-enable transistor N1 remains turned off because the enable signal E 315 is inverted by the inverter 325 and fed to the gate of N1. This creates a high impedance path between node 'B' and GND, which causes the voltage potential of node 'B' to remain latched at a high level. After the latches 'A' and 'B' have hit their trip point (i.e., their "no turning back" point) at 740, then the voltage levels at nodes 'A' and 'B' become firmly resolved and latched with node 'A' at a low level and node 'B' at a high level. The inverter 335 inverts the voltage potential of node 'A,' and as a result, a high level is output as the gated clock signal CLK 310 as shown at 730, thereby following or mimicking the clock pulse 705.

The enable signal E 315 is de-asserted at 725, which in this case, happens to occur when the clock signal CLK 305 is high (i.e., during the evaluation window 707). When, as here, the enable signal E 315 is appropriately setup relative to the clock edge (e.g., 720), and even when the enable signal E 315 turns off (e.g., at 725) while the clock signal 305 is high, then the gated clock signal CLK 310 essentially follows or mimics the clock signal CLK 305. In other words, in this state, node 'A' swings between VDD and GND at the frequency of the clock signal CLK 305. As a result, the gated clock signal CLK 310 swings between VDD and GND at the frequency of node 'A,' although at an opposite polarity due to the inverter 335. After the enable signal E 315 turns off, and the entire clock pulse 707 is fully propagated to the gated clock signal CLK 310 (i.e., as pulse 732), then the gated clock signal CLK 310 returns to a quiescent state. It will be understood that the gated clock signal CLK 310 can follow any number of clock cycles of the clock signal CLK 305 depending on the value of the enable signal E 315.

More specifically, the de-assertion of the enable signal E 315 at 725 causes the enable transistor N3 to turn off and the inverse-enable transistor N1 to turn on. As a result, node 'B' is temporarily pulled to GND as shown at 745 because a conductive path is formed from node 'B' through transistors N1 and N4 to GND. Meanwhile, node 'A' remains at a low level because the latch 'A' has latched the voltage potential of node 'A' to the low level, which prevents any glitches in the gated clock signal CLK 310 that might have otherwise been caused by the de-assertion of the enable signal E 315 during the evaluation window 707.

As shown at 730 and 732, the gated clock signal CLK 310 substantially follows or substantially mimics the clock signal CLK 305. This occurs because nodes 'A' and 'B' are each pre-charged during each low level of each clock cycle of CLK 305, which causes the gated clock signal CLK 310 to also be set to the low level. Then, during each evaluation window (e.g., 705, 707, etc.), node 'A' is pulled down because, as explained above, the asserted enable signal E 315 creates a conductive path to GND. This cycle can repeat indefinitely as long as the enable signal E 315 is properly asserted. After the enable signal E 315 is de-asserted, node 'A' remains latched at a high level because the enable transistor N3 is turned off. Therefore, the gated clock signal CLK 310 is placed in the quiescent state.

Notably, there is a borrowed time period 710 similar to the borrowed time period 510 of FIG. 5. A detailed description of the borrowed time 710 is omitted here for the sake of brevity. It will be understood, however, that the borrowed time 710 functions in a similar or same fashion as that of the borrowed time 510.

Figure 8:
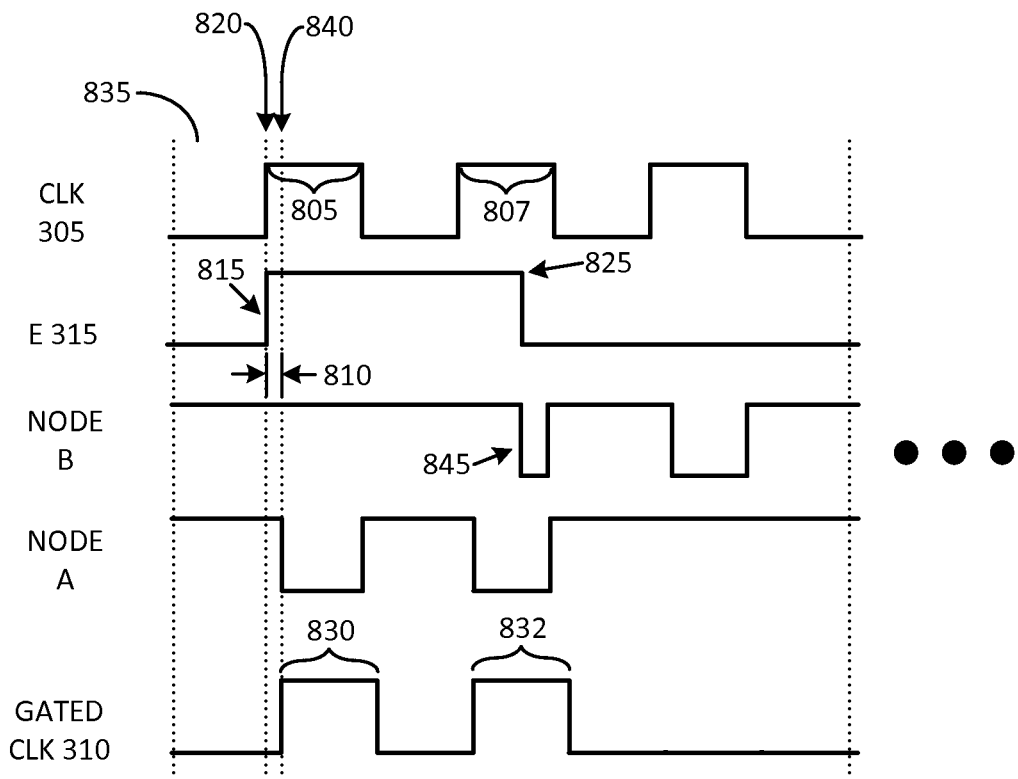
FIG. 8 is still another example waveform timing diagram showing various waveforms associated with the CICG circuits of FIGS. 3 and/or 4, in accordance with inventive concepts.

FIG. 8 is still another example waveform timing diagram showing various waveforms associated with the CICG circuits of FIGS. 3 and/or 4, in accordance with inventive concepts. The primary difference between the waveform diagram of FIG. 8 relative to the waveform diagram of FIG. 7 is that the enable signal E 315 is asserted at the same time as the rising edge of the clock signal CLK 305. Reference is now made to FIGS. 3, 4, and 8.

As shown in FIG. 8, during a disabled mode 835, the clock signal CLK 305 is held at a low level, which causes node 'B' and node 'A' to be pre-charged to a high level. In this example, the enable signal E 315 is then asserted (e.g., at 815) at the same time or substantially the same time as the beginning 820 of the evaluation window 805. The rising edge 820 of the clock signal CLK 305 begins the evaluation mode. When the evaluation mode begins, latches 'A' and 'B' evaluate the voltages at nodes 'A' and 'B,' respectively.

In particular, there is a borrowed time period 810 in which the CICG circuit can determine the value of the enable signal E 315, even when the enable signal E 315 is asserted very close to, at the same time as, or even after the rising edge 820 of the clock signal CLK 305. In other words, the borrowed time period 810 is "borrowed" from the evaluation window 805 and added to the setup time to enhance the performance characteristics and tolerances of the CICG circuit. More specifically, the borrowed time period 810 is made possible due to the trip point difference between the latch 'A' and the latch 'B.' Such latch trip point difference occurs as a result of the nature of how the complimentary switch logic evaluates and latches voltage levels at nodes 'A' and 'B' during the evaluation mode.

Because of the beneficial delay caused by the complimentary latches during the evaluation and latching phases, the enable signal E 315 has more time to be evaluated properly. As a result, the enable signal E 315 can arrive closer to or at the same time as the rising edge 820 of the clock signal CLK 305, and still be properly evaluated. In some embodiments, the enable signal E 315 can even arrive after the rising edge 820 of the clock signal CLK 305, and still be properly evaluated. This is referred to as a negative setup time.

Since in this case, the enable signal E 315 is appropriately setup relative to the rising edge 820 of the clock signal CLK 305, the following events occur. At 820, the pre-charge transistors P1 and P2 are turned off and the evaluation transistor N4 is turned on. The control transistor N2 remains turned on because, as mentioned above, node 'B' is initially pre-charged and latched to a high level, which is fed to the gate of N2. The enable transistor N3 also remains turned on because the enable signal E 315 is at a high level. Thus, a conductive path between node 'A' and GND is formed, which pulls node 'A' to a low level.

Meanwhile, the inverse-enable transistor N1 remains turned off because the enable signal E 315 is inverted by the inverter 325 and fed to the gate of N1. This creates a high impedance path between node 'B' and GND, which causes the voltage potential of node 'B' to remain latched at a high level. After the latches 'A' and 'B' have hit their trip point (i.e., their "no turning back" point) at 840, then the voltage levels at nodes 'A' and 'B' become firmly resolved and latched with node 'A' at a low level and node 'B' at a high level. The inverter 335 inverts the voltage potential of node 'A,' and as a result, a high level is output as the gated clock signal CLK 310 as shown at 830, thereby following or mimicking the clock pulse 805.

The enable signal E 315 is de-asserted at 825, which in this case, happens to occur when the clock signal CLK 305 is high (i.e., during the evaluation window 807). When, as here, the enable signal E 315 is appropriately setup relative to the clock edge (e.g., 820), and even when the enable signal E 315 turns off (e.g., at 825) while the clock signal 305 is high, then the gated clock signal CLK 310 essentially follows or mimics the clock signal CLK 305. In other words, in this state, node 'A' swings between VDD and GND at the frequency of the clock signal CLK 305. As a result, the gated clock signal CLK 310 swings between VDD and GND at the frequency of node 'A,' although at an opposite polarity due to the inverter 335. After the enable signal E 315 turns off, and the entire clock pulse 807 is fully propagated to the gated clock signal CLK 310 (i.e., as pulse 832), then the gated clock signal CLK 310 returns to a quiescent state. It will be understood that the gated clock signal CLK 310 can follow any number of clock cycles of the clock signal CLK 305 depending on the value of the enable signal E 315.

More specifically, the de-assertion of the enable signal E 315 at 825 causes the enable transistor N3 to turn off and the inverse-enable transistor N1 to turn on. As a result, node 'B' is temporarily pulled to GND as shown at 845 because a conductive path is formed from node 'B' through transistors N1 and N4 to GND. Meanwhile, node 'A' remains at a low level because the latch 'A' has latched the voltage potential of node 'A' to the low level, which prevents any glitches in the gated clock signal CLK 310 that might have otherwise been caused by the de-assertion of the enable signal E 315 during the evaluation window 807.

As shown at 830 and 832, the gated clock signal CLK 310 substantially follows or substantially mimics the clock signal CLK 305. This occurs because nodes 'A' and 'B' are each pre-charged during each low level of each clock cycle of CLK 305, which causes the gated clock signal CLK 310 to also be set to the low level. Then, during each evaluation window (e.g., 805, 807, etc.), node 'A' is pulled down because, as explained above, the asserted enable signal E 315 creates a conductive path to GND. This cycle can repeat indefinitely as long as the enable signal E 315 is properly asserted. After the enable signal E 315 is de-asserted, node 'A' remains latched at a high level because the enable transistor N3 is turned off. Therefore, the gated clock signal CLK 310 is placed in the quiescent state.

Figure 9:
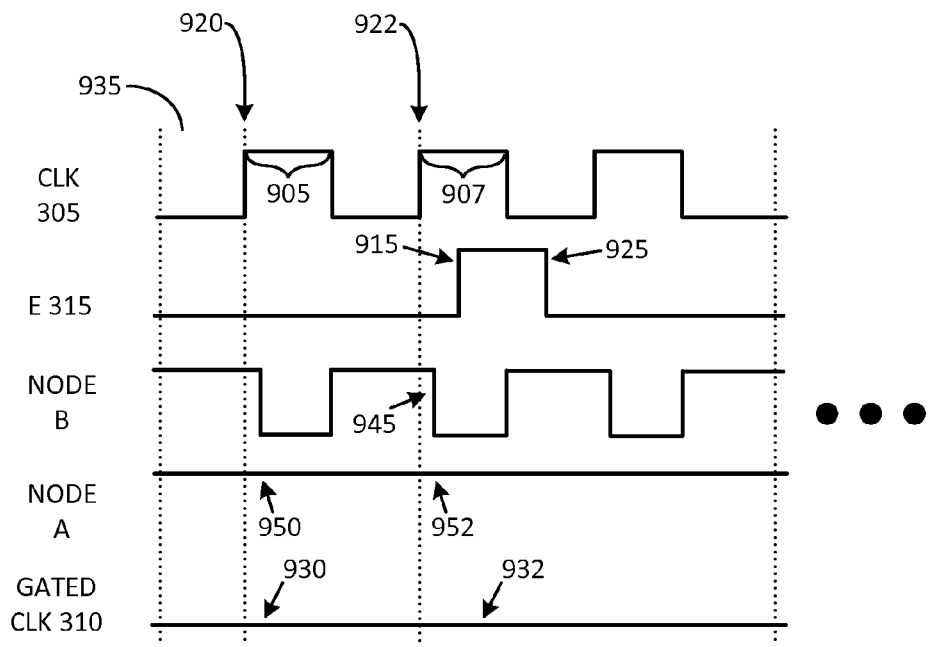
FIG. 9 is another example waveform timing diagram showing various waveforms associated with the CICG circuits of FIGS. 3 and/or 4, in accordance with inventive concepts.

FIG. 9 is another example waveform timing diagram showing various waveforms associated with the CICG circuits of FIGS. 3 and/or 4, in accordance with inventive concepts. FIG. 9 is similar to FIG. 6, but in addition, the waveforms shown for nodes 'A' and 'B' are shown, along with other notations as described in detail below. Reference is now made to FIGS. 3, 4, and 9.

As shown in FIG. 9, during a disabled mode 935, the clock signal CLK 305 is held at a low level, which causes node 'B' and node 'A' to be pre-charged to a high level. The rising edge 920 of the clock signal CLK 305 begins the evaluation mode. When the evaluation mode begins, latches 'A' and 'B' evaluate the voltages at nodes 'A' and 'B,' respectively.

In this example, the first evaluation window is 905. Since at this time, the enable signal E 315 is held to a low level, the enable transistor N3 remains turned off, and the node 'A' remains latched at a high level as shown at 950. As a result, the gated clock CLK 310 remains at a low level as shown at 930 due to the inverter 335.

Nodes 'A' and 'B' are pre-charged and latched to a high level (e.g., VDD) when the clock signal CLK 305 swings to a low level. The next evaluation window is 907, which begins at the rising edge 922 of the clock signal CLK 305. At 922, the pre-charge transistors P1 and P2 are turned off and the evaluation transistor N4 is turned on. The enable transistor N3 initially remains turned off because the enable signal E 315 has not yet arrived. The inverse-enable transistor N1, on the other hand, initially remains turned on due to the inverter 325. Thus, a conductive path is formed between node 'B' and GND, and the latch 'B' evaluates and latches node 'B' at a low level as shown at 945. However, node 'A' remains latched at a high level as shown at 952 because of the high impedance path between node 'A' and GND, despite the ongoing oscillations of the clock signal CLK 305.

After the "no turning back" point, the voltage levels at nodes 'A' and 'B' become firmly resolved and latched with node 'A' at a high level and node 'B' at a low level. The inverter 335 inverts the voltage potential of node 'A,' and as a result, a low level is maintained as the gated clock signal CLK 310.

In this example, the enable signal E 315 is then asserted (e.g., at 915) during the evaluation window 907. In other words, the enable signal E 315 is asserted when the clock signal CLK 305 is high. This is similar to Case 2 from FIG. 6. Even though the enable signal E 315 is asserted part-way through the evaluation window 907, the gated clock CLK 310 remains at a low level because of the following events.

The assertion of the enable signal E 315 causes the enable transistor N3 to turn on, however, since the node 'B' is at a low level (as previously indicated at 945), the control transistor N2 remains turned off, and therefore, a high impedance path still exists between node 'A' and GND. For this reason, node 'A' remains latched at the high level. And as a result, the gated clock CLK 310 remains at a low level as shown at 932.

The enable signal E 315 is de-asserted at 925, which in this case, happens to occur when the clock signal CLK 305 is low and when the nodes 'A' and 'B' are being pre-charged. As a result, the de-assertion of the enable signal E 315 has no effect on the gated clock signal CLK 310. Thus, the quiescent state of the gated clock signal CLK 310 is maintained.

Figure 10:
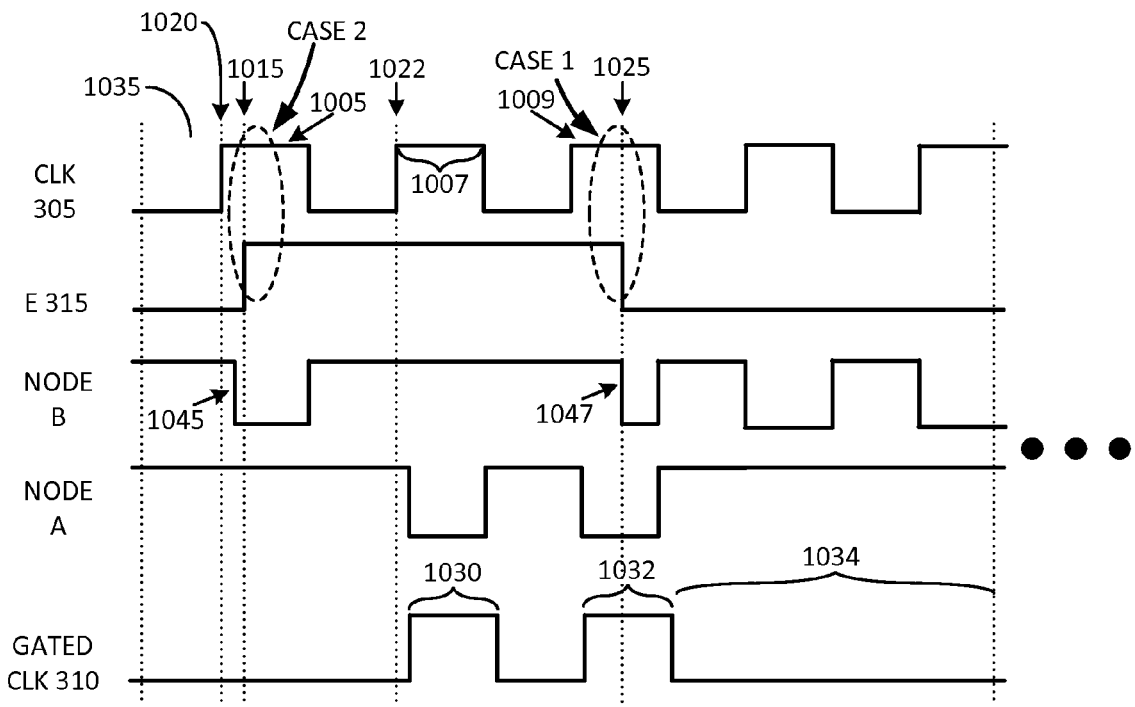
FIG. 10 illustrates a more complex example waveform timing diagram showing various waveforms associated with the CICG circuits of FIGS. 3 and/or 4, in accordance with inventive concepts.

FIG. 10 illustrates a more complex example waveform timing diagram showing various waveforms associated with the CICG circuits of FIGS. 3 and/or 4, in accordance with inventive concepts. This example shows a combination of the Case 1 and Case 2 examples described above. Reference is now made to FIGS. 3, 4, and 10.

As shown in FIG. 10, during a disabled mode 1035, the clock signal CLK 305 is held at a low level, which causes node 'B' and node 'A' to be pre-charged to a high level. The rising edge 1020 of the clock signal CLK 305 begins the evaluation mode. When the evaluation mode begins, latches 'A' and 'B' evaluate the voltages at nodes 'A' and 'B,' respectively.

In this example, the first evaluation window is 1005, which begins at the rising edge 1020 of the clock signal CLK 305. At 1020, the pre-charge transistors P1 and P2 are turned off and the evaluation transistor N4 is turned on. The enable transistor N3 initially remains turned off because the enable signal E 315 has not yet arrived. The inverse-enable transistor N1, on the other hand, initially remains turned on due to the inverter 325. Thus, a conductive path is formed between node 'B' and GND, and the latch 'B' evaluates and latches node 'B' at a low level as shown at 1045. However, node 'A' remains latched at a high level because of the high impedance path between node 'A' and GND.

After the "no turning back" point at 1045, the voltage levels at nodes 'A' and 'B' are firmly resolved and latched with node 'A' at a high level and node 'B' at a low level. The inverter 335 inverts the voltage potential of node 'A,' and as a result, a low level is maintained as the gated clock signal CLK 310.

In this example, the enable signal E 315 is then asserted (e.g., at 1015) during the evaluation window 1005. In other words, the enable signal E 315 is asserted when the clock signal CLK 305 is high. This is similar to Case 2 from FIGS. 6 and 9, and therefore, some of the details of the process are not repeated.

Here, even though the enable signal E 315 is asserted part-way through the evaluation window 1005, the gated clock CLK 310 remains at a low level because of the following events. The assertion of the enable signal E 315 causes the enable transistor N3 to turn on, however, since the node 'B' is at a low level (as previously indicated at 1045), the control transistor N2 remains turned off, and therefore, a high impedance path still exists between node 'A' and GND. For this reason, node 'A' remains latched at the high level. And as a result, the gated clock CLK 310 remains at a low level. Since the enable signal E 315 was not appropriately setup relative to the rising edge 1020 of the clock signal CLK 305, the gated clock CLK 310 does not follow the clock signal CLK 305, at least for this clock pulse.

Nevertheless, given that the enable signal E 315 is setup appropriately relative to the next evaluation window 1007 beginning with the rising edge 1022, the gated clock signal CLK 310 is activated and follows or otherwise mimics the clock signal CLK 305, as shown at 1030 and 1032. This is similar to Case 1 described above. The detailed description for this type of sequence of events is provided above with reference to FIGS. 5 and 7, and therefore, some of the description is not repeated here for the sake of brevity.

With regard to the de-assertion of the enable signal E 315 at 1025, which in this case, happens to occur when the clock signal CLK 305 is high (i.e., during the evaluation window 1009), a sequence of events similar to that illustrated in FIG. 7 occurs. Even when the enable signal E 315 turns off (e.g., at 1025) while the clock signal 305 is high, the gated clock signal CLK 310 essentially follows or mimics the clock signal CLK 305, at least for that clock pulse. In other words, in this state, node 'A' swings between VDD and GND at the frequency of the clock signal CLK 305. As a result, the gated clock signal CLK 310 swings between VDD and GND at the frequency of node 'A,' although at an opposite polarity due to the inverter 335. After the enable signal E 315 turns off, and the entire clock pulse 1009 is fully propagated to the gated clock signal CLK 310 (i.e., as pulse 1032), then the gated clock signal CLK 310 returns to a quiescent state as shown at 1034. It will be understood that the gated clock signal CLK 310 can follow any number of clock cycles of the clock signal CLK 305 depending on the value of the enable signal E 315.

More specifically, the de-assertion of the enable signal E 315 at 1025 causes the enable transistor N3 to turn off and the inverse-enable transistor N1 to turn on. As a result, node 'B' is temporarily pulled to GND as shown at 1047 because a conductive path is formed from node 'B' through transistors N1 and N4 to GND. Meanwhile, node 'A' remains at a low level because the latch 'A' has latched the voltage potential of node 'A' to the low level, which prevents any glitches in the gated clock signal CLK 310 that might have otherwise been caused by the de-assertion of the enable signal E 315 during the evaluation window 1009.

As shown at 1030 and 1032, the gated clock signal CLK 310 substantially follows or mimics the clock signal CLK 305. This occurs because nodes 'A' and 'B' are each pre-charged during each low level of each clock cycle of CLK 305, which causes the gated clock signal CLK 310 to also be set to the low level. Then, during each evaluation window (e.g., 1007, 1009, etc.), node 'A' is pulled down because, as explained above, the asserted enable signal E 315 creates a conductive path to GND. This cycle can repeat indefinitely as long as the enable signal E 315 is properly asserted. After the enable signal E 315 is de-asserted, node 'A' remains latched at a high level because the enable transistor N3 is turned off. Therefore, the gated clock signal CLK 310 is placed in the quiescent state as illustrated at 1034.

FIGS. 11-16 are schematic diagrams of a various devices in which the processor and/or logic having one or more CICG circuit can be embedded, in accordance with inventive concepts.

Figure 11:
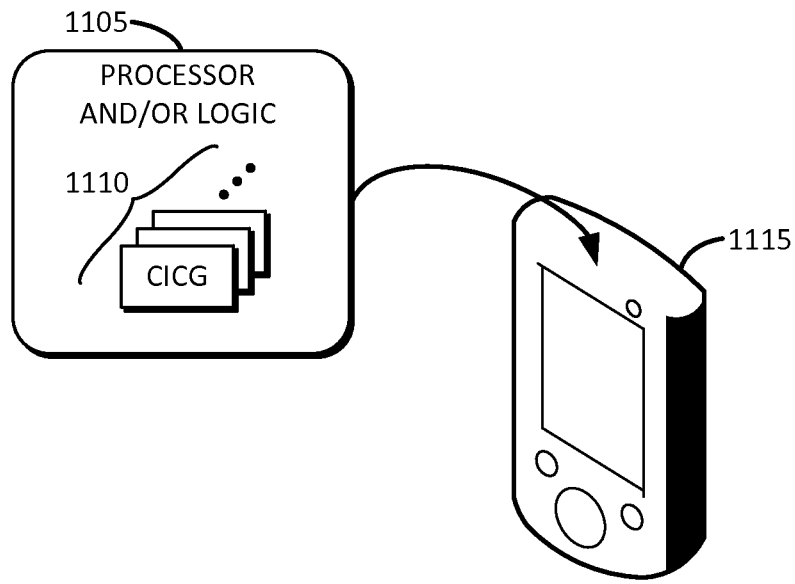
FIGS. 11-16 are schematic diagrams of a various devices in which the processor and/or logic having one or more CICG circuit can be embedded, in accordance with inventive concepts.
Figure 12:
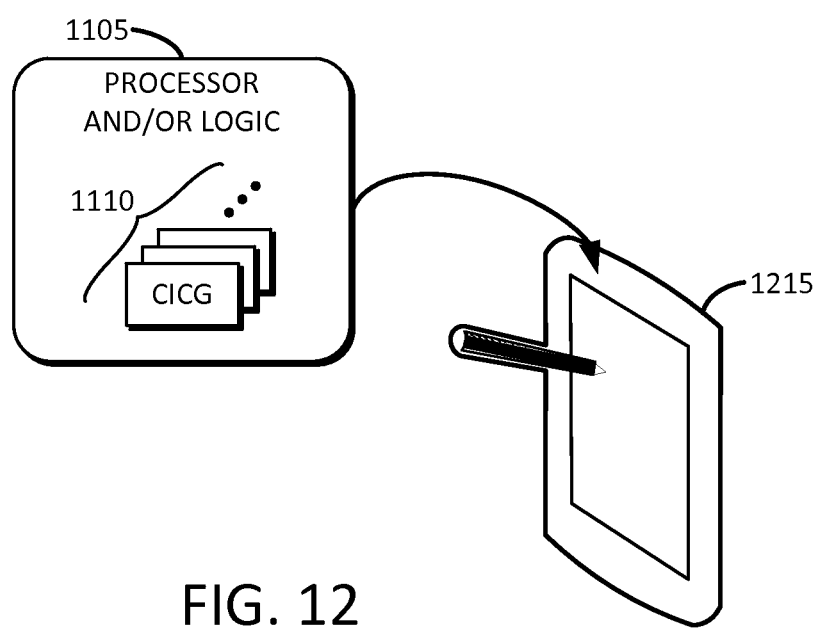
Figure 13:
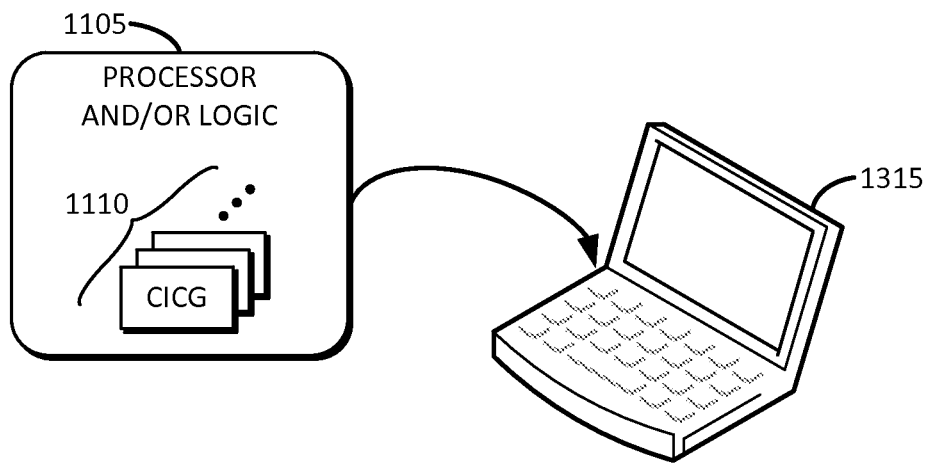
Figure 14:
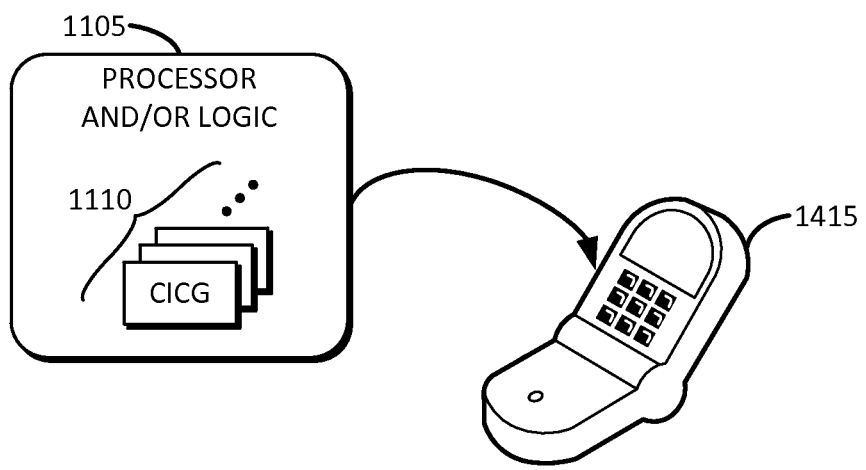
Figure 15:
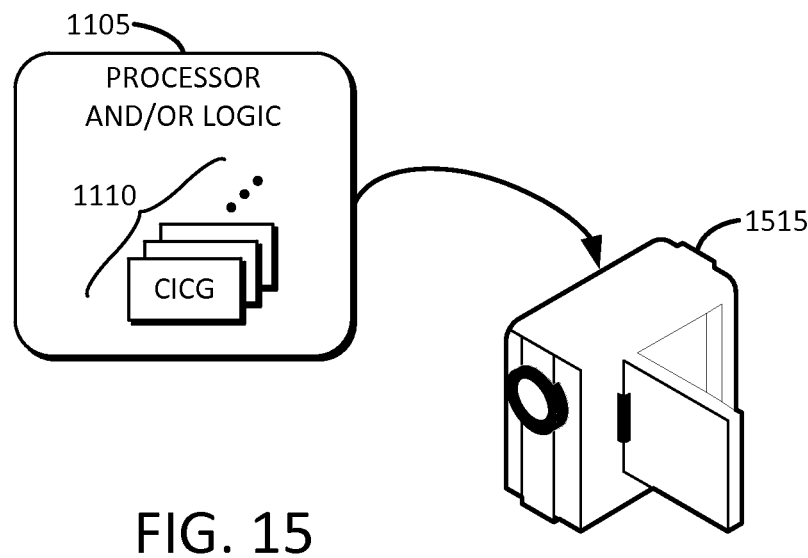
Figure 16:
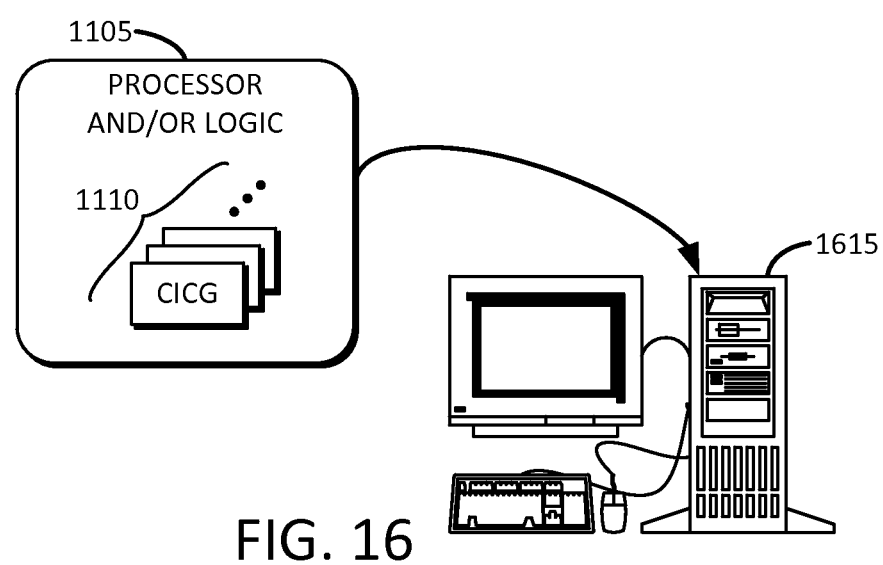

For example, as can be seen in FIG. 11, smart phone 1115 can include processor and/or logic 1105, which can include one or more CICG circuits 1110, as described in detail above. Similarly, the tablet 1215 shown in FIG. 12, the notebook computer 1315 shown in FIG. 13, the mobile phone 1415 shown in FIG. 14, the camera 1515 shown in FIG. 15, and the desktop computer 1615 shown in FIG. 16 can include one or more CICG circuits 1110, as described in detail above. It will be understood that any suitable device that uses a clock signal can include or otherwise operate with one or more CICG circuits 1110, as described in detail above.

Figure 17:
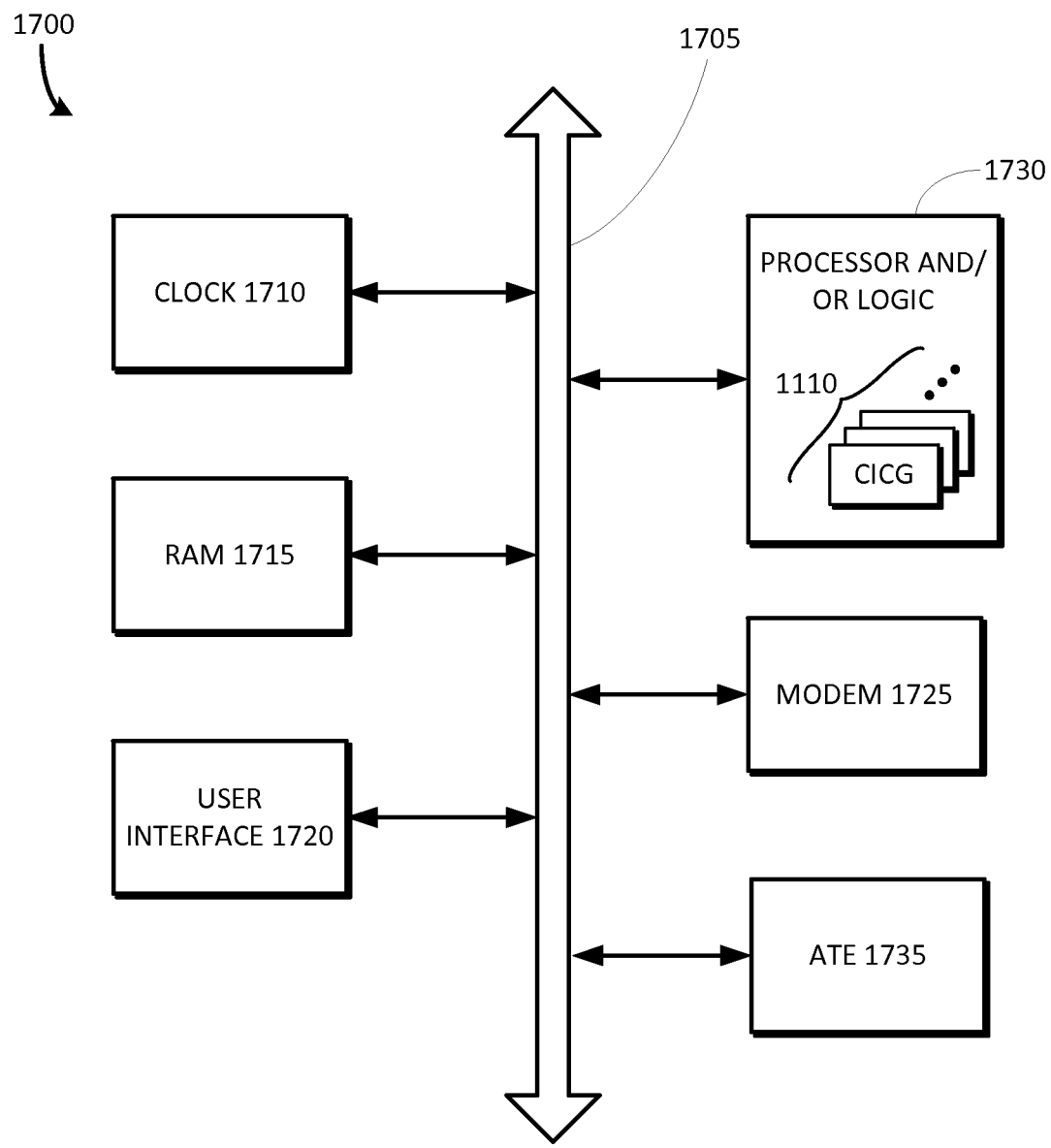
FIG. 17 is a block diagram of a computing system including a processor and/or logic having one or more CICG circuits according to embodiments of the inventive concept as disclosed herein.

FIG. 17 is a block diagram of a computing system 1700 including a processor and/or logic 1730 having one or more CICG circuits 1110 according to embodiments of the inventive concept as disclosed herein. Referring to FIG. 17, the computing system 1700 may also include a clock 1710, a random access memory (RAM) 1715, a user interface 1720, a modem 1725 such as a baseband chipset, and/or automated test equipment (ATE) 1735, any or all of which may be electrically coupled to a system bus 1705. The processor and/or logic 1730, including the one or more CICG circuit 1110 as set forth herein, may also be electrically coupled to the system bus 1705.

Using the inventive concepts described herein, a significant reduction in clock tree power can be achieved with little to no effect on performance. A balance of performance and low power consumption is achieved. Battery life for mobile devices is therefore extended. All or substantially all PICG and PREICG circuits can be replaced with CICG circuits. Such approach allows high-speed processors, such as a high-speed ARM core, to reduce total CPU clock power by up to 30% without degrading the maximum possible frequency. In addition, hold times are reduced. Moreover, minimum pulse width requirement specifications are more readily met. Overall, a more robust clock gater circuit is provided due to reduced susceptibility to voltage and thermal gradients that otherwise induce variability in timing.

Other advantages include an improved enable-to-enabled-clock delay of the CICG circuit relative to the traditional ICG implementations. The complimentary switch logic structure allows pulse-style performance without the pulser circuit power penalty. The clock input pin load is also smaller. The CICG circuit possesses improved power consumption characteristics in comparison to traditional ICG implementations, both when enabled and disabled. When enabled, the dynamic power consumption is reduced by removing the conventional pulse-based integrated clock gater circuit. A 25% reduction in power, or thereabout, can be achieved when in the active or enabled mode. When disabled, the dynamic power consumption is also reduced by removing the conventional pulse-based integrated clock gater circuit. A 50% reduction in power, or thereabout, can be achieved as a result. Additionally, the CICG circuit reduces the need for low-voltage instantaneous voltage droop (LV IVD) margin needed in PICG circuits for pulse width variation.

The following discussion is intended to provide a brief, general description of a suitable machine or machines in which certain aspects of the invention can be implemented. Typically, the machine or machines include a system bus to which is attached processors, memory, e.g., random access memory (RAM), read-only memory (ROM), or other state preserving medium, storage devices, a video interface, and input/output interface ports. The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like. The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciate that network communication can utilize various wired and/or wireless short range or long range carriers and protocols, including radio frequency (RF), satellite, microwave, Institute of Electrical and Electronics Engineers (IEEE) 545.11, Bluetooth®, optical, infrared, cable, laser, etc.

Embodiments of the invention can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access.

Having described and illustrated the principles of the invention with reference to illustrated embodiments, it will be recognized that the illustrated embodiments can be modified in arrangement and detail without departing from such principles, and can be combined in any desired manner. And although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the invention to particular embodiment configurations. As used herein, these terms can reference the same or different embodiments that are combinable into other embodiments.

Embodiments of the invention may include a non-transitory machine-readable medium comprising instructions executable by one or more processors, the instructions comprising instructions to perform the elements of the inventive concepts as described herein.

The foregoing illustrative embodiments are not to be construed as limiting the invention thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this inventive concept as defined in the claims.

What is claimed is:

1. A complimentary voltage switched integrated clock gater (CICG) circuit, comprising:
    first and second pre-charge transistors configured to receive a clock signal;
    a first node connected to the first pre-charge transistor, the first pre-charge transistor being configured to pre-charge the first node responsive to the clock signal;
    a second node connected to the second pre-charge transistor, the second pre-charge transistor being configured to pre-charge the second node responsive to the clock signal;
    a first latch directly connected to the first node; and
    a second latch directly connected to the second node.

2. The CICG circuit of claim 1, further comprising:
    an inverter connected to the first node, the inverter being configured to invert a voltage level of the first node and to produce a gated clock signal.

3. The CICG circuit of claim 1, further comprising:
    an evaluation transistor configured to receive the clock signal;
    an enable transistor connected to the evaluation transistor and configured to receive an enable signal; and
    an inverse-enable transistor directly connected to the second node and to the evaluation transistor, the inverse-enable transistor being configured to receive an inverted enable signal.

4. The CICG circuit of claim 3, further comprising:
    a control transistor connected to the first node, the second node, and the enable transistor, wherein the second node is directly connected to a gate of the control transistor.

5. The CICG circuit of claim 3, wherein:
    the evaluation transistor is connected to a low voltage potential; and
    the first and second pre-charge transistors are connected to a high voltage potential that is higher than the low voltage potential.

6. The CICG circuit of claim 3, wherein:
    the first pre-charge transistor is configured to pre-charge the first node to a first voltage level responsive to the clock signal having a second voltage level;
    the second pre-charge transistor is configured to pre-charge the second node to the first voltage level responsive to the clock signal having the second voltage level;
    the first latch is configured to latch the first node to the second voltage level responsive to the clock signal having the first voltage level; and
    the second latch is configured to latch the second node to the first voltage level responsive to the clock signal having the first voltage level.

7. The CICG circuit of claim 3, wherein:
    the first latch is configured to latch the first node to the second voltage level responsive to the enable signal having the first voltage level; and
    the second latch is configured to latch the second node to the first voltage level responsive to the enable signal having the first voltage level.

8. The CICG circuit of claim 3, wherein:
    a source of the enable transistor is connected to a drain of the evaluation transistor; and
    a source of the inverse-enable transistor is connected to the drain of the evaluation transistor.

9. The CICG circuit of claim 3, wherein:
    a drain of the inverse-enable transistor is directly connected to the second node.

10. A system for gating a clock signal using complimentary switch logic, the system comprising:
    a system bus;
    memory connected to the system bus;
    a user interface associated with the system bus and the memory; and
    a processor configured to control the memory and the user interface via the system bus, the processor including one or more complimentary voltage switched integrated clock gater (CICG) circuits, wherein the one or more CICG circuits further comprise:

first and second pre-charge transistors configured to receive a clock signal;

a first node connected to the first pre-charge transistor, the first pre-charge transistor being configured to pre-charge the first node responsive to the clock signal;

a second node connected to the second pre-charge transistor, the second pre-charge transistor being configured to pre-charge the second node responsive to the clock signal;

a first latch directly connected to the first node; and a second latch directly connected to the second node.

11. The system of claim 10, wherein the one or more CICG circuits further comprise:

an inverter connected to the first node, the inverter being configured to invert a voltage level of the first node and to produce a gated clock signal.

12. The system of claim 10, wherein the one or more CICG circuits further comprise:

an evaluation transistor configured to receive the clock signal;

an enable transistor connected to the evaluation transistor and configured to receive an enable signal; and an inverse-enable transistor directly connected to the second node and to the evaluation transistor, the inverse-enable transistor being configured to receive an inverted enable signal.

13. The system of claim 12, wherein the one or more CICG circuits further comprise:

a control transistor connected to the first node, the second node, and the enable transistor, wherein the second node is directly connected to a gate of the control transistor.

14. The system of claim 12, wherein:

the evaluation transistor is connected to a low voltage potential; and the first and second pre-charge transistors are connected to a high voltage potential that is higher than the low voltage potential.

15. The system of claim 12, wherein:

the first pre-charge transistor is configured to pre-charge the first node to a first voltage level responsive to the clock signal having a second voltage level;

the second pre-charge transistor is configured to pre-charge the second node to the first voltage level responsive to the clock signal having the second voltage level;

the first latch is configured to latch the first node to the second voltage level responsive to the clock signal having the first voltage level; and the second latch is configured to latch the second node to the first voltage level responsive to the clock signal having the first voltage level.

16. The system of claim 12, wherein:

the first latch is configured to latch the first node to the second voltage level responsive to the enable signal having the first voltage level; and the second latch is configured to latch the second node to the first voltage level responsive to the enable signal having the first voltage level.

17. The system of claim 12, wherein:

a source of the enable transistor is connected to a drain of the evaluation transistor; and a source of the inverse-enable transistor is connected to the drain of the evaluation transistor.

18. The system of claim 12, wherein:

a drain of the inverse-enable transistor is directly connected to the second node.

\* \* \* \* \*